(12) United States Patent
Jeon

(10) Patent No.: US 9,713,256 B2
(45) Date of Patent: Jul. 18, 2017

(54) CURVED DISPLAY DEVICE

(71) Applicant: SAMSUNG DISPLAY CO., LTD., Yongin, Gyeonggi-Do (KR)

(72) Inventor: Man Bok Jeon, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 25 days.

(21) Appl. No.: 14/656,837

(22) Filed: Mar. 13, 2015

(65) Prior Publication Data

US 2016/0088726 A1 Mar. 24, 2016

(30) Foreign Application Priority Data

Sep. 23, 2014 (KR) ........................ 10-2014-0127053

(51) Int. Cl.
*H05K 1/00* (2006.01)
*H05K 1/14* (2006.01)
*H05K 1/02* (2006.01)
*G02F 1/1345* (2006.01)
*H01L 27/32* (2006.01)

(52) U.S. Cl.
CPC ......... *H05K 1/147* (2013.01); *G02F 1/13452* (2013.01); *H05K 1/0281* (2013.01); *G09G 2300/0408* (2013.01); *H01L 27/3276* (2013.01); *H01L 2251/5338* (2013.01); *H05K 2201/09018* (2013.01); *H05K 2201/10128* (2013.01); *H05K 2201/10136* (2013.01); *H05K 2201/10681* (2013.01)

(58) Field of Classification Search
USPC ................................. 361/749, 750
See application file for complete search history.

(56) References Cited

U.S. PATENT DOCUMENTS

2007/0254455 A1* 11/2007 Yamaguchi ......... H01L 21/8221 438/455
2008/0042549 A1* 2/2008 Song ................... G09G 3/3225 313/498

FOREIGN PATENT DOCUMENTS

JP 05-335696 A 12/1993
KR 10-2006-0064960 A 6/2006
KR 10-0623724 B1 9/2006

* cited by examiner

*Primary Examiner* — Andargie M Aychillhum
(74) *Attorney, Agent, or Firm* — Lee & Morse P.C.

(57) ABSTRACT

A curved display device includes a semiconductor chip package including a base film, a plurality of driving chips on the base film, and an input wire unit and an output wire unit connected to the driving chips, a printed circuit board (PCB) connected to the input wire unit of the semiconductor chip package, and a display panel including a display unit and a pad unit connected to the output wire unit of the semiconductor chip package, wherein the display panel, the semiconductor chip package, and the PCB are bendable in a first direction, and the driving chips of the of the semiconductor chip package are separated from each other in the first direction.

14 Claims, 16 Drawing Sheets

CURVED DISPLAY DEVICE

CROSS-REFERENCE TO RELATED APPLICATION

Korean Patent Application No. 10-2014-0127053, filed on Sep. 23, 2014, in the Korean Intellectual Property Office, and entitled: "Curved Display Device," is incorporated by reference herein in its entirety.

BACKGROUND

1. Field

The described technology relates generally to a curved display device, and more particularly, to a curved display device including a chip-on-film semiconductor chip package.

2. Description of the Related Art

A flat panel display, e.g., a liquid crystal display (LCD) and an organic light emitting diode (OLED) display, includes a display unit formed of a plurality of pixels disposed on a substrate, to perform predetermined display by controlling on and off of the pixels and luminance. Glass is typically used as a substrate for the flat panel display. However, a flexible display device that can be bent or folded has recently been developed by employing a flexible material, e.g., plastic, as the substrate.

The flexible display device may be applied to a small electronic device, e.g., a mobile device, and a large electronic device, e.g., a television. In the case of the large electronic device, the flexible display device can provide a bent screen to apply a 3D effect to the screen that is viewed by a user. For example, a curved display device that is concavely bent with respect to a viewer satisfies all viewing angles of the viewer, as compared with a flat display device, and has less image distortion according to the viewing angles.

Similar to the flat display device, the curved display device has a basic configuration including a display panel, a printed circuit board (PCB), and a chip-on-film semiconductor chip package which connects the display panel to the PCB. The semiconductor chip package may include a driving chip and wires that are connected to the driving chip. The PCB outputs a control signal for controlling the driving chip.

SUMMARY

The described technology has been made in an effort to provide a curved display device capable of preventing a defect, e.g., a crack or peeling-off of a semiconductor chip package, by reducing stress applied to the semiconductor chip package by bending.

An exemplary embodiment provides a curved display device, including a semiconductor chip package including a base film, a plurality of driving chips on the base film, and an input wire unit and an output wire unit connected to the driving chips, a printed circuit board (PCB) connected to the input wire unit of the semiconductor chip package, and a display panel including a display unit and a pad unit connected to the output wire unit of the semiconductor chip package, wherein the display panel, the semiconductor chip package, and the PCB are bendable in a first direction, and the driving chips of the of the semiconductor chip package are separated from each other in the first direction.

The input wire unit may be simultaneously connected to the plurality of driving chips, and a connection wire for transferring a carry signal may be disposed between adjacent driving chips. The input wire unit may include a plurality of input wires, and each of the input wires may include main wires and branched wires branched from the main wires and connected to the driving chips.

The driving chips may receive the same data through the input wire unit, and input data may be stored in a corresponding driving chip according to the carry signal. The driving chips may output an analog voltage to which the input data is converted, to the output wire unit according to an input synchronization signal.

Each of the driving chips may include two long sides, and the two long sides may be parallel with the first direction or with a second direction crossing the first direction.

An exemplary embodiment provides a curved display device including: a semiconductor chip package including a base film, a driving chip on a first surface of the base film, an input wire unit and an output wire unit connected to the driving chip, and a plurality of groove portions on a second surface of the base film; a printed circuit board (PCB) connected to the input wire unit; and a display panel including a display unit and a pad unit connected to the output wire unit, wherein the display panel, the semiconductor chip package, and the PCB are bendable in a first direction, and the groove portions are longitudinally disposed in a second direction crossing the first direction.

The groove portions may be densely disposed to have a smaller distance apart as they are farther distanced from a center of the base film.

An exemplary embodiment provides a curved display device including: a semiconductor chip package including a base film, a driving chip on the base film, and an input wire unit and an output wire unit connected to the driving chip; a printed circuit board (PCB) connected to the input wire unit; and a display panel including a display unit and a pad unit connected to the output wire unit, wherein the display panel, the semiconductor chip package, and the printed circuit board are bendable in a first direction, and the output wire unit includes a plurality of output wires having a smaller distance apart as they are farther distanced from a center of the base film.

The output wires may be grouped according to kinds of output signals, and the output wires within each group may be disposed at equal distances apart. The output wires may include first wires disposed at the center of the base film to output varying signals, and second wires disposed at an outer peripheral portion of the base film to output fixed signals.

The second wires may include third wires for outputting option signals, fourth wires for outputting power signals, and fifth wires for outputting ground signals, and the third wires, the fourth wires, and the fifth wires may be sequentially disposed in the stated order relative to the first wires.

The output wire unit may include a plurality of output wires, the plurality of output wires at an outer peripheral portion of the base film including respective extensions at end portions thereof. The input wire unit may include a plurality of input wires, the plurality of input wires at an outer peripheral portion of the base film including respective extensions at end portions thereof.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
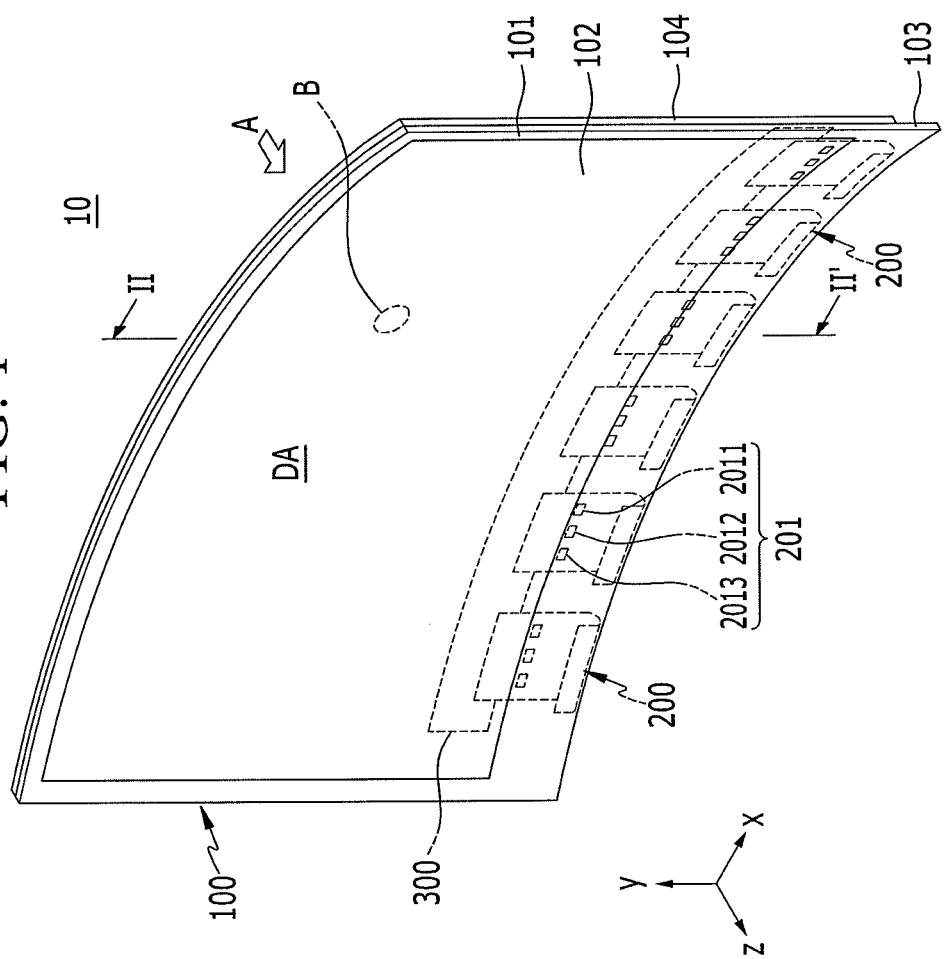
FIG. 1 illustrates a perspective view of a curved display device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, unless explicitly described to the contrary, the word "comprise" and variations such as "comprises" or "comprising" will be understood to imply the further inclusion of other elements. In addition, the size and thickness of each configuration shown in the drawings are arbitrarily shown for understanding and ease of description, but the present disclosure is not limited thereto.

Figure 2:
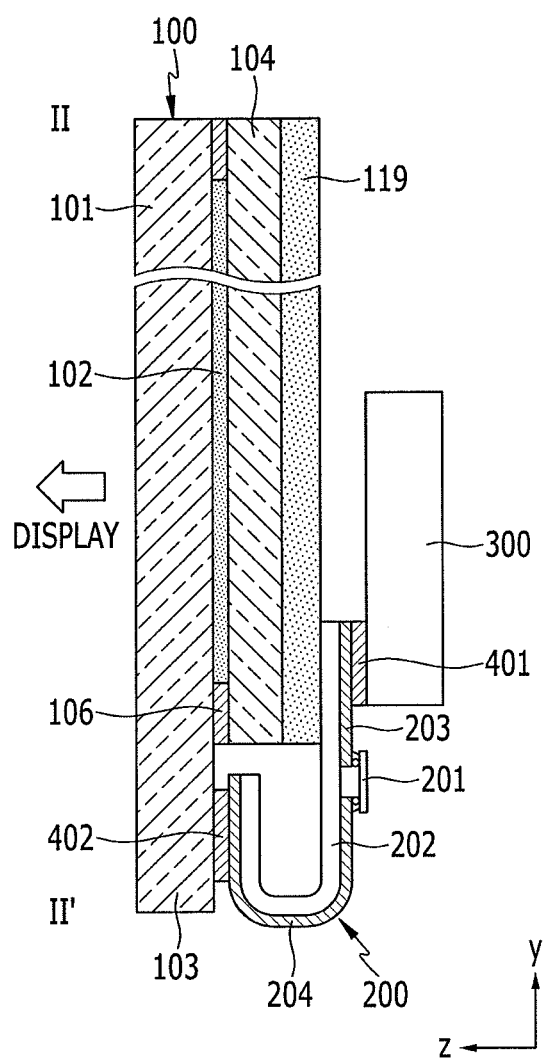
FIG. 2 illustrates a cross-sectional view along line II-II' of FIG. 1.
Figure 3:
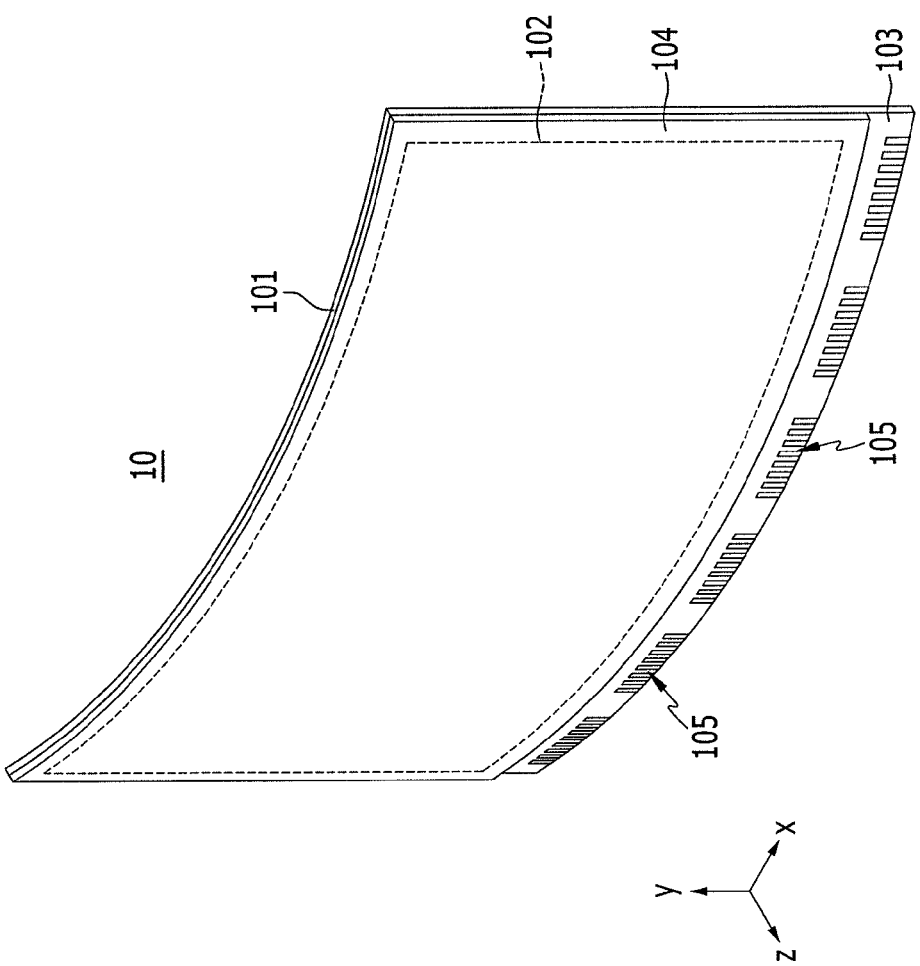
FIG. 3 illustrates a perspective view of a display panel of the curved display device shown in FIG. 1 that is viewed in a direction A.

FIG. 1 illustrates a perspective view of a curved display device according to a first exemplary embodiment, FIG. 2 illustrates a cross-sectional view along the line II-II' of FIG. 1, and FIG. 3 illustrates a perspective view of a display panel of the curved display device shown in FIG. 1 that is viewed in a direction A.

Referring to FIGS. 1-3, a curved display device 10 of the first exemplary embodiment may include a display panel 100, a semiconductor chip package 200, and a printed circuit board (PCB) 300. The semiconductor chip package 200 may include a driving chip 201, and is physically and electrically connected to the display panel 100 and the printed circuit board 300. As illustrated in FIG. 1, the display panel 100, the semiconductor chip package 200, and the printed circuit board 300 are concavely bendable in a first direction, e.g., an x-axis direction, by a predetermined curvature. It is noted that the first direction may also be referred to as a horizontal direction.

The display panel 100 includes a substrate 101 with a display area DA defined on the substrate 101, a display unit 102 having a plurality of pixels on the substrate 101, a pad unit 103 disposed outside the display unit 102, and an encapsulation substrate 104 for covering and sealing the display unit 102. As illustrated in FIG. 3, pad electrodes 105 electrically connected to the plurality of pixels are disposed on the pad unit 103.

The display panel 100 may include at least one of an organic light emitting diode panel, a liquid crystal panel, a plasma display panel, and an electrophoretic display panel. In the case of the organic light emitting diode panel, the display unit 102 includes at least two thin film transistors, at least one capacitor, and one organic light emitting element in each sub-pixel.

Each of the substrate 101 and the encapsulation substrate 104 may be made of bendable thin-film glass, or a plastic film, e.g., polyimide, polyethylene terephthalate, polycarbonate, polyethylene naphthalate, polyarylate, and polyether imide. As illustrated in FIG. 2, the encapsulation substrate 104 may be secured to the substrate 101 by a sealant 106 which is coated along an edge of the display unit 102.

Figure 4:
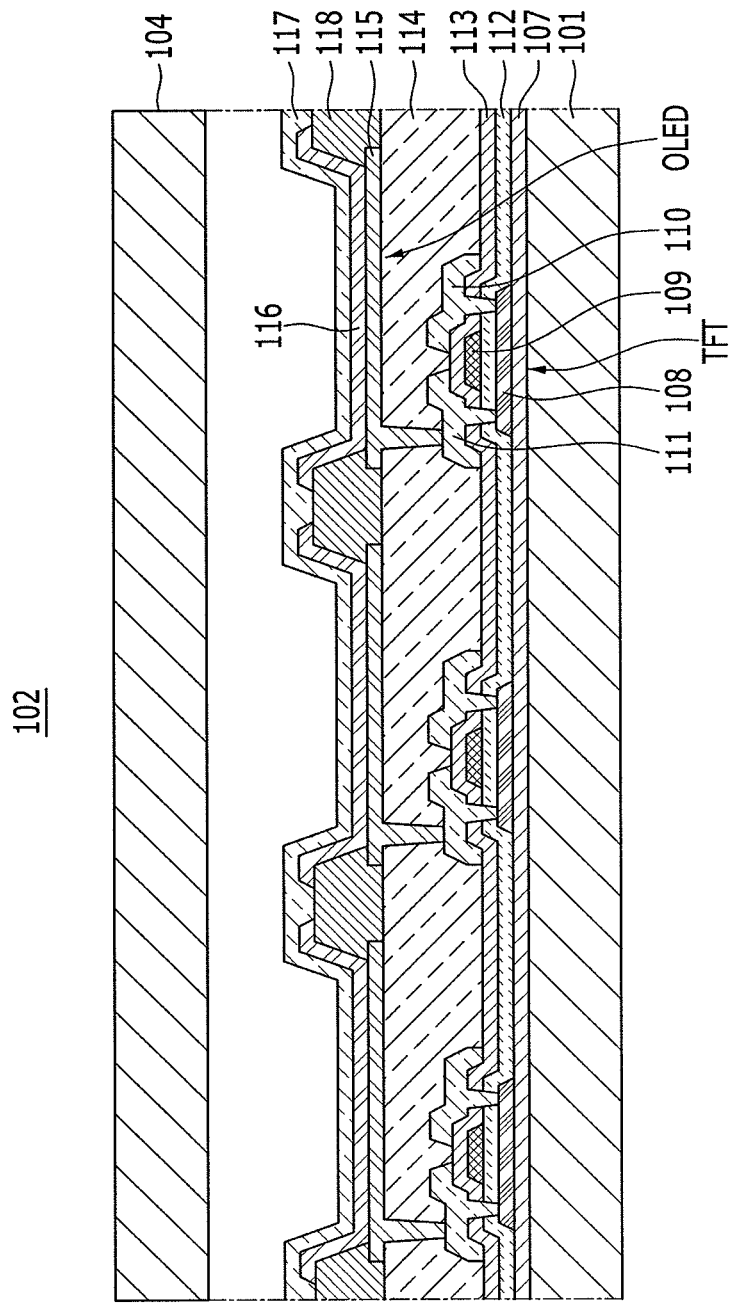
FIG. 4 illustrates an enlarged cross-sectional view of a region B in FIG. 1.

FIG. 4 illustrates an enlarged cross-sectional view of region B in FIG. 1. As an example, a case of an organic light emitting diode panel as the display panel 100 will be described.

Referring to FIG. 4, a buffer layer 107 may be formed on the substrate 101. The buffer layer 107 prevents penetration of impure elements and provides a flat surface to an upper portion of the substrate 101. The buffer layer 107 may contain an inorganic material, e.g., $SiO_2$ or SiNx, or an organic material, e.g., polyimide, polyester, or acryl.

A thin film transistor (TFT) is formed on the buffer layer 107. The thin film transistor (TFT) includes an active layer 108, a gate electrode 109, a source electrode 110, and a drain electrode 111. The active layer 108 may be made of an inorganic semiconductor, e.g., amorphous silicon or polysilicon, an organic semiconductor, or an oxide semiconductor, and may include a source region, a drain region, and a channel region. One driving thin film transistor is illustrated in FIG. 4.

A gate insulating layer 112 is formed on the active layer 108. The gate insulating layer 112 insulates the active layer 108 and the gate electrode 109 from each other, and may include an inorganic material, e.g., $SiO_2$ or SiNx, or an organic material. The gate electrode 109 is formed on the gate insulating layer 112. The gate electrode 109 may be disposed to overlap the channel region of the active layer 108, and may include, e.g., Au, Ag, Cu, Ni, Pt, Pd, Al, Mo, or the like.

An interlayer insulating layer 113 is formed on the gate electrode 109. The interlayer insulating layer 113 is disposed between the gate electrode 109 and the source electrode 110 and between the gate electrode 109 and the drain electrode 111 to insulate therebetween. The interlayer insulating layer 113 may include an inorganic material, e.g., $SiO_2$ or SiNx, and may have a dual-layer structure, e.g., a $SiO_2$ layer and a SiNx layer.

The source electrode 110 and a drain electrode 111 are formed on the interlayer insulating layer 113. In this case, via holes are formed in the interlayer insulating layer 113 and the gate insulating layer 112 to expose the source region and the drain region of the active layer 108, and the source electrode 110 and the drain electrode 111 respectively contact the source region and the drain region of the active layer 108 through the via holes.

In FIG. 4, a top-gate thin film transistor is illustrated as an example, but the structure of the thin film transistor is not limited thereto. The thin film transistor is covered with a passivation layer 114 to be protected thereby, and is electrically connected to the organic light emitting diode to drive the organic light emitting diode.

The passivation layer 114 may be formed of an inorganic insulating layer or an organic insulator, or may be formed to have a structure in which the inorganic insulating layer and the organic insulator are stacked. The inorganic insulating layer may include, e.g., $SiO_2$, SiNx, $Al_2O_3$, $TiO_2$, $Ta_2O_5$, $HfO_2$, $ZrO_2$, or the like, and the organic insulator may include, e.g., polymethyl methacrylate (PMMA), polystyrene (PS), an acryl-based polymer, an imide-based polymer, an arylether-based polymer, or the like.

The organic light emitting diode is formed on the passivation layer 114, and includes a pixel electrode 115, an interlayer 116, and a common electrode 117. One pixel electrode 115 is provided for each sub-pixel, and contacts the drain electrode 111 through a via hole formed in the passivation layer 114. The common electrode 117 is formed on the entire display area DA. When the display panel 100 is a bottom emission type, the pixel electrode 115 is a transparent or translucent electrode, and the common electrode 117 is a reflective electrode.

The pixel electrode 115 may be formed of a metal thin film including at least one of, e.g., Li, Ca, LiF/Ca, LiF/Al, Al, Ag, Mg, or the like, and an auxiliary electrode layer including at least one of, e.g., ITO, IZO, ZnO, $In_2O_3$, or the like may be formed on the metal thin film. The common electrode 117 may include a reflective film including at least one of, e.g., Au, Ag, Mg, Al, Pt, Pd, Ni, Nd, Ir, Cr, or the like, and a transparent or translucent layer formed on the reflective film. The transparent or translucent layer may include, e.g., ITO (indium tin oxide), IZO (indium zinc oxide), ZnO, $In_2O_3$, or the like.

A pixel defining layer 118 is formed on the pixel electrode 115. The pixel defining layer 118 exposes a predetermined portion of the pixel electrode 115, and the interlayer 116 including an organic emission layer is formed on the exposed pixel electrode 115. The organic emission layer may be a low molecular weight organic material or a high molecular weight organic material, and the interlayer 116 may include at least one of a hole injection layer, a hole transport layer, an electron transport layer, and an electron injection layer, in addition to the organic emission layer.

Light emitted from the organic emission layer is reflected by the common electrode 117, and is discharged to the outside through the pixel electrode 115 and the substrate 101. The display panel 100 of the present exemplary embodiment is not limited to the bottom emission type, and may be a top emission type or a both-sides emission type. In the case of the top emission type, the pixel electrode 115 is a reflective electrode, and the common electrode 117 is a transparent electrode or a translucent electrode.

Referring back to FIGS. 1-3, the aforementioned display unit 102 includes a plurality of gate lines (not shown), a plurality of data lines (not shown) disposed to cross the gate lines while maintaining insulation from the gate lines, and a plurality of common power lines (not shown).

The pad unit 103 is disposed at a side of the display unit 102 along a second direction (a y-axis direction). For example, as illustrated in FIG. 3, the pad unit 103 may be disposed below the display unit 102 along the y-axis direction. The pad electrodes 105 formed in the pad unit 103 may be connected to the data lines and the common power lines in the display unit 102, and the driving chip 201 of the semiconductor chip package 200 attached to the pad unit 103 may serve as a data driver (source driver) for outputting a data signal to the data lines.

As illustrated in FIG. 2, the semiconductor chip package 200 may include a base film 202, the driving chip 201 mounted on the base film 202, and an input wire unit 203 and an output wire unit 204 formed on the base film 202 to be electrically connected to the driving chip 201. As illustrated in FIG. 1, a plurality of semiconductor chip packages 200 may be separated from each other along the first direction, e.g., along the x-axis direction, on the pad unit 103.

The base film 202 may be formed of a plastic film, e.g., polyimide. The driving chip 201 may be bonded on the base film 202 through an electrode bump in a flip-chip method. A portion to which the driving chip 201 is bonded is protected from the external environment by a resin layer filled by an underfill method The input wire unit 203 is disposed at one side of the driving chip 201, and the output wire unit 204 is disposed at another side thereof. Each of the input wire unit 203 and the output wire unit 204 includes a plurality of wires, and remaining regions other than end portions of the input wire unit 203 and the output wire unit 204 are covered and protected by solder resists (not shown).

A first end of the semiconductor chip package 200 is attached to the printed circuit board 300 by a first anisotropic conductive film 401. Accordingly, pad electrodes (not shown) of the printed circuit board 300 are electrically connected to the input wire unit 203, and the printed circuit board 300 outputs a signal for controlling the driving chip 201 through the input wire unit 203.

A second end of the semiconductor chip package 200 is attached to the pad unit 103 of the display panel 100 through a second anisotropic conductive film 402. Accordingly, the pad electrodes 105 of the pad unit 103 are electrically connected to the output wire unit 204, and an output signal of the driving chip 201 is transferred to the pad electrodes 105.

When a direction passing through the input wire unit 203, the driving chip 201, and the output wire unit 204 is referred to as 'a longitudinal direction' of the semiconductor chip package 200, the semiconductor chip package 200 is bent along the longitudinal direction thereof such that the printed circuit board 300 is overlapped with the display panel 100. In other words, the 'longitudinal direction' extends along the y-axis direction of FIG. 1.

The printed circuit board 300 faces a side that is opposite to a display surface. In FIG. 2, reference numeral 119 indicates a buffer member disposed between the encapsulation substrate 104 and the printed circuit board 300. The buffer member 119 may be omitted.

As the display panel 100 is bent along the first direction with a predetermined curvature, i.e., along the x-axis direction, the semiconductor chip package 200 receives a force that allows it to be bent along 'a transversal direction' that crosses the longitudinal direction with the same curvature as that of the display panel 100. In other words, the semiconductor chip package 200 is bent along the first direction, i.e., along the x-axis direction, together with the display panel 100 to have the same predetermined curvature as the display panel 100. In this case, the base film 202 of the semiconductor chip package 200 and the printed circuit board 300 may have flexibility that is similar to that of the display panel 100, while the driving chip 201 has no flexibility or extremely low flexibility.

Accordingly, since a driving chip may have little or no flexibility, stress may be generated around the driving chip during bending of the conventional semiconductor chip package with the flexible display panel. Therefore, according to exemplary embodiments, the driving chip 201 may include a plurality of driving chips spaced apart from each other along the bending direction, thereby relieving stress around the driving chip 201 during bending. This will be described in more detail below with reference to FIGS. 5-6.

Figure 5:
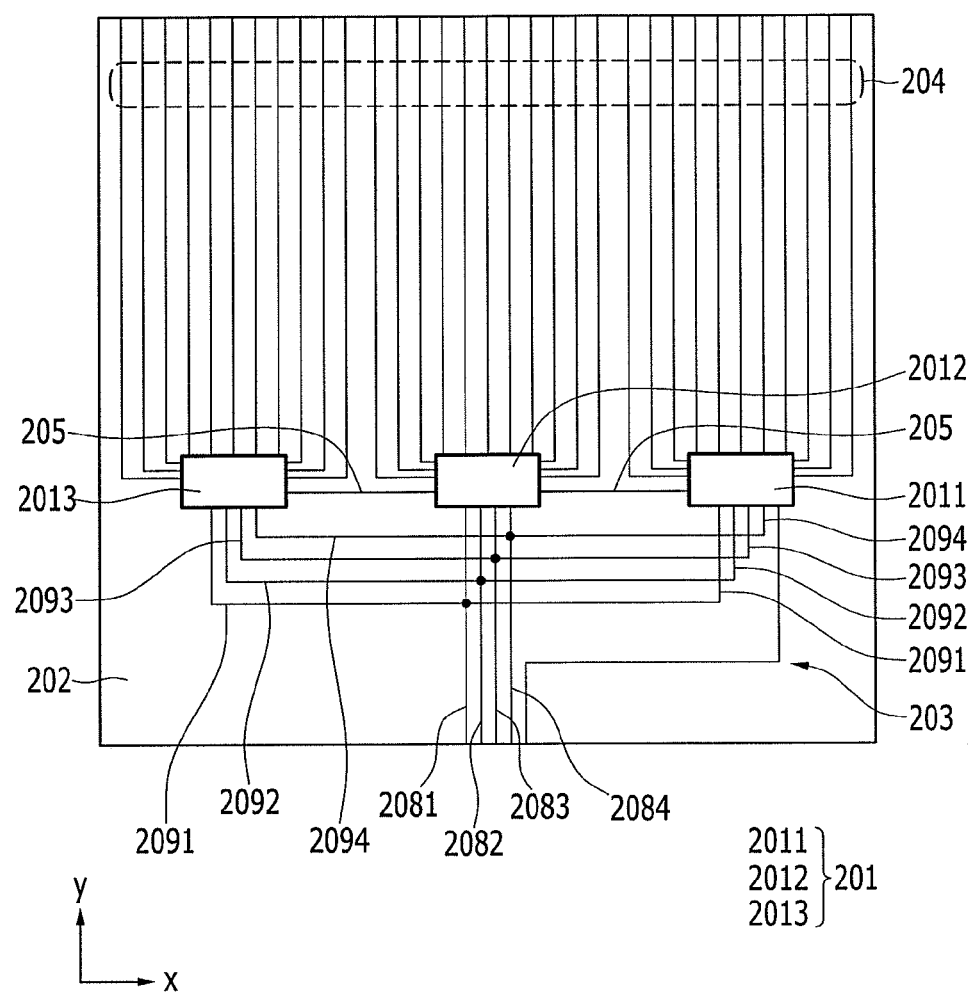
FIG. 5 illustrates a top plan view of a state of the curved display device shown in FIG. 1 in which a semiconductor chip package is unfolded.

FIG. 5 illustrates a top plan view of an unfolded semiconductor chip package 200 on the curved display device 10. It is noted that the unfolded semiconductor chip package refers to a semiconductor chip package that is not bent, i.e., in a flat state.

Referring to FIG. 5, the semiconductor chip package 200 includes a plurality of driving chips 2011, 2012, and 2013 that are spaced apart from each other along the transversal direction, i.e., the horizontal direction as viewed in FIG. 5, rather than including a single driving chip. In detail, higher resolution of the display unit 102 may further increase the number of channels, thereby lengthening the driving chip. However, if a semiconductor chip package were to include a bendable driving chip having a long length, a crack could be generated in the long driving chip. Further, minute peeling could be generated between the long driving chip and the input wire unit or between the long driving chip and the output wire unit.

In contrast, according to the present exemplary embodiment, the semiconductor chip package 200 includes a plurality of driving chips, e.g., driving chips 2011, 2012, and 2013, that are spaced apart from each other. The plurality of driving chips is connected by a cascade method while maintaining the same number of channels as that of conventional channels. That is, the driving chips 2011, 2012, and 2013 are divided to be separated from each other, and the input wire unit 203 is connected together, e.g., simultaneously, to the driving chips 2011, 2012, and 2013. The driving chips 2011, 2012, and 2013 may be connected to each other by a connection wire 205 for transferring a carry signal.

Each of the input wires of the input wire unit 203 includes a plurality of main wires 2081, 2082, 2083, and 2084 connected to the printed circuit board 300, and a plurality of branched wires 2091, 2092, 2093, and 2094 that are branched from the respective main wires 2081, 2082, 2083, and 2084 and are connected to each of the driving chips 2011, 2012, and 2013. All of the branched wires 2091, 2092, 2093, and 2094 are insulated from each other.

Corresponding data is input into any one of the main wires 2081, 2082, 2083, and 2084. Data output from the main wires 2081, 2082, 2083, and 2084 may be simultaneously transferred to the driving chips 2011, 2012, and 2013 through the branched wires 2091, 2092, 2093, and 2094.

For example, first data is input into the first main wire 2081, and the first data is simultaneously transferred to the driving chips 2011, 2012, and 2013 through the first branched wires 2091 branched from the first main wire 2081. Second data is input into the second main wire 2082, and the second data is simultaneously transferred to the driving chips 2011, 2012, and 2013 through the second branched wires 2092 branched from the second main wire 2082.

Three divided driving chips 2011, 2012, and 2013 are illustrated in FIG. 5, but the number of driving chips is not limited thereto. Further, for convenience of illustration, the input wire unit 203 including four input wires is illustrated in FIG. 5 as an example, but the number of input wires may be greater than that of the illustrated input wires. The output wire unit 204 includes output wires that are connected to the driving chips 2011, 2012, and 2013.

In the semiconductor chip package 200 having the aforementioned structure, the same data may be input into all the driving chips 2011, 2012, and 2013, and the input data may be stored in a corresponding one of the driving chips 2011, 2012, and 2013 according to the carry signal that is applied from each of the driving chips 2011, 2012, and 2013.

For example, when the same first data is input into the first to third driving chips 2011, 2012, and 2013, the first data is stored in the first driving chip 2011 according to a start signal. Once the first data is completely stored, the carry signal may be transferred from the first driving chip 2011 to the second driving chip 2012 through the connection wire 205. An additional input wire may be connected to the first driving chip 2011 to apply the start signal.

When the same second data is input into the first to third driving chips 2011, 2012, and 2013 together with the transferring of the carry signal, the second data is stored in the second driving chip 2012 by the carry signal transferred to the second driving chip 2012. Once the second data is completely stored, the carry signal may be transferred from the second driving chip 2012 to the third driving chip 2013 through the connection wire 205. When the same third data is input into the first to third driving chips 2011, 2012, and 2013 together with the transferring of the carry signal, the third data is stored in the third driving chip 2013 by the carry signal transferred to the third driving chip 2013.

Next, the first to third driving chips 2011, 2012, and 2013 may respectively and simultaneously output analog voltages, to which first data to third data are converted, to output wires by a synchronization signal and the like applied from the outside of the driving chip. In this case, an additional input wire (not shown) may be connected to each of the driving chips 2011, 2012, and 2013 to apply the synchronization signal.

Further, the third driving chip 2013 can generate a synchronization signal according to an input carry signal to transfer it to the second driving chip 2012 and the first driving chip 2011. According to the transferred synchronization signal, analog voltages, to which first data to third data are converted, may be simultaneously output to corresponding output wires. In this case, an additional wire (not shown) may be disposed between the third driving chip 2013 and the second driving chip 2012 and between the third driving chip 2013 and the first driving chip 2011.

For example, when a synchronization signal is output from the third driving chip 2013 to the second driving chip 2012 and the first driving chip 2011, the first driving chip 2011 may output an analog voltage, to which input first data is converted, to output wires connected to the first driving chip 2011 by input of the synchronization signal. Similarly, the second driving chip 2012 may output an analog voltage, to which input second data is converted, to output wires connected to the second driving chip 2012 by input of the synchronization signal. In this case, the third driving chip 2013 outputting the synchronization signal may also output an analog voltage, to which input third data is converted, to output wires connected to the third driving chip 2013 by input of the synchronization signal.

Figure 6:
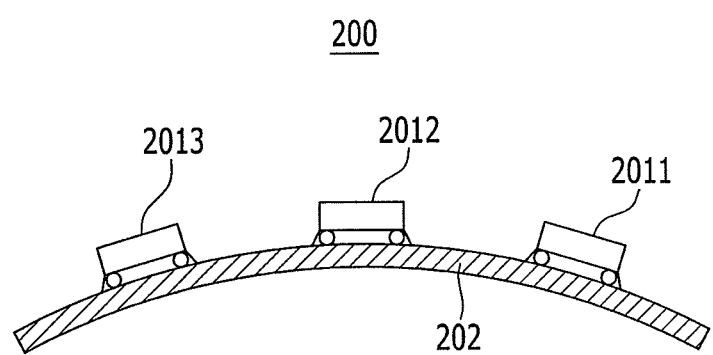
FIG. 6 illustrates a width-directional cross-sectional view of the semiconductor chip package of the curved display device shown in FIG. 1.

FIG. 6 illustrates a width-directional cross-sectional view of the semiconductor chip package 200 in FIG. 1.

Referring to FIG. 5 and FIG. 6, as the semiconductor chip package 200 includes the driving chips 2011, 2012, and 2013 divided, e.g., spaced apart, along the transversal direction, the semiconductor chip package 200 is more flexibly bendable along the transversal direction, e.g., as compared with a semiconductor chip package including a single long driving chip along the transversal direction. As such, stress caused by bending around the driving chips 2011, 2012, and 2013 may be more efficiently reduced.

Accordingly, the curved display device 10 according to the first exemplary embodiment can suppress generation of defects such as cracks of the driving chips 2011, 2012, and 2013, cracks of the input wire unit 203 or the output wire unit 204, minutely peeling between the driving chips 2011, 2012, and 2013 and the input wire unit 203 or the output wire unit 204, peeling between the semiconductor chip package 200 and the pad unit 103, and peeling between the semiconductor chip package 200 and the printed circuit board 300, which may be generated in a bending condition, and can improve durability and reliability of products.

In FIG. 5, the case that each of the driving chips 2011, 2012, and 2013 is longitudinally disposed in a transversal direction is illustrated. In other words, each of the driving chips 2011, 2012, and 2013 may have two long sides that are parallel with the transversal direction. In this case, an entirety of the input wire unit 203 and a part of the output wire unit 204 may be connected to each of the long sides of the driving chips 2011, 2012, and 2013, and a part of the output wire unit 204 and the connection wires 205 may be connected to each of the short sides of the driving chips 2011, 2012, and 2013.

Figure 7:
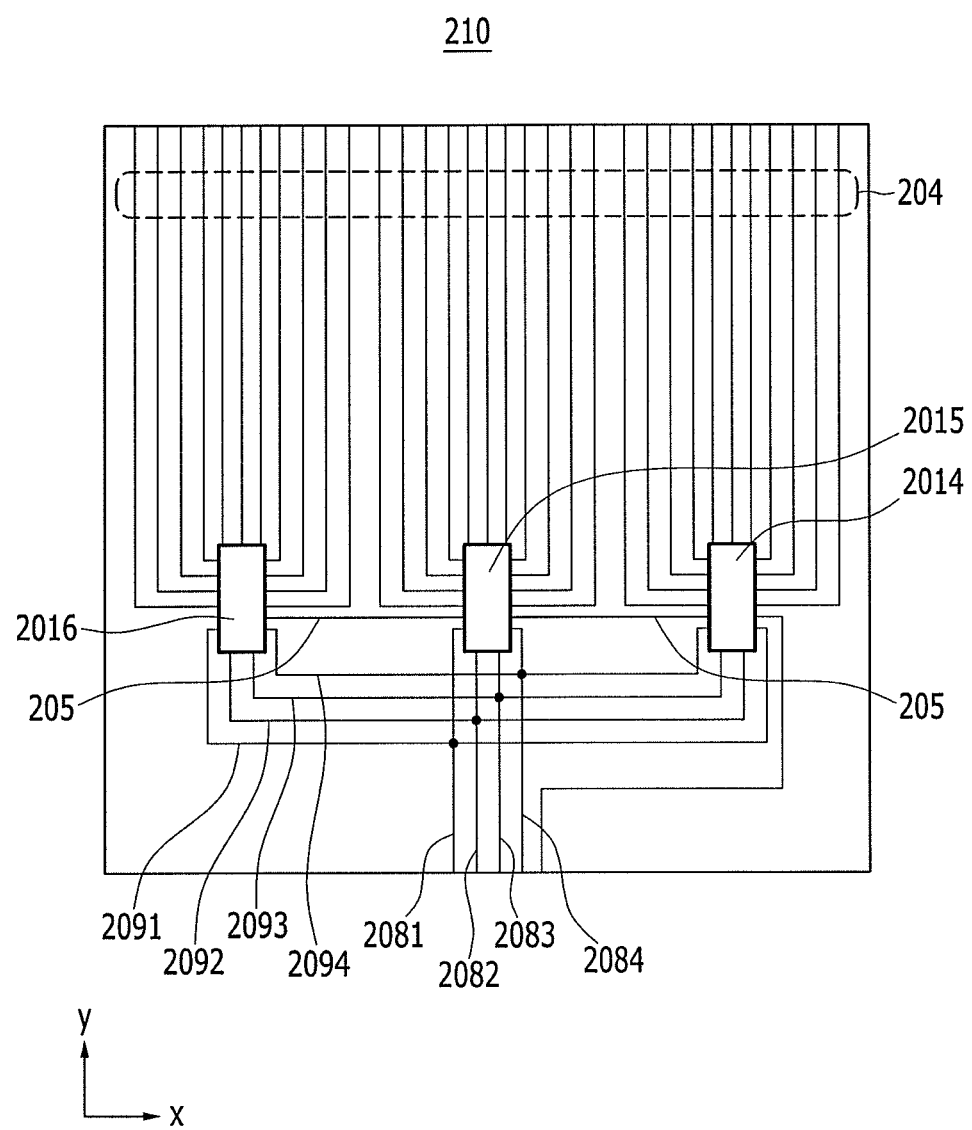
FIG. 7 illustrates a top plan view of an exemplary variation of the semiconductor chip package shown in FIG. 5.
Figure 8:
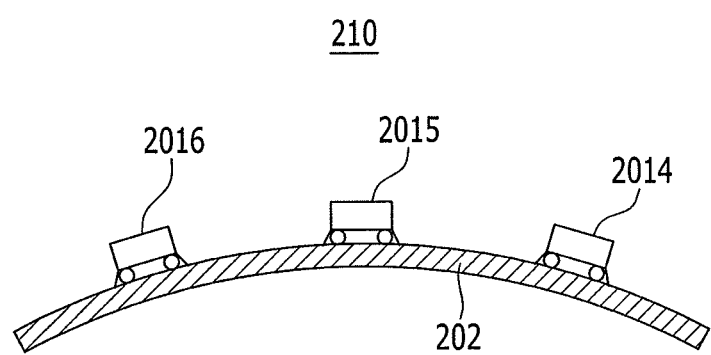
FIG. 8 illustrates a width-directional cross-sectional view of the semiconductor chip package shown in FIG. 7.

FIG. 7 illustrates a top plan view of an exemplary variation of the semiconductor chip package shown in FIG. 5, and FIG. 8 illustrates a width-directional cross-sectional view of the semiconductor chip package shown in FIG. 7.

Referring to FIG. 7 and FIG. 8, each of a plurality of driving chips 2014, 2015, and 2016 may be longitudinally disposed in a longitudinal direction (i.e., a vertical direction on the basis of the drawings) of the semiconductor chip package 210. In other words, each of the driving chips 2014, 2015, and 2016 may have two long sides that are parallel with the longitudinal direction.

In this case, each width of the driving chips 2014, 2015, and 2016 becomes smaller than that of FIG. 5. Accordingly, the semiconductor chip package 210 according to the exemplary variation is more flexibly bendable along the transversal direction as compared with the structure shown in FIG. 5, and a stress caused by bending around the driving chips 2014, 2015, and 2016 may be further reduced.

Figure 9:
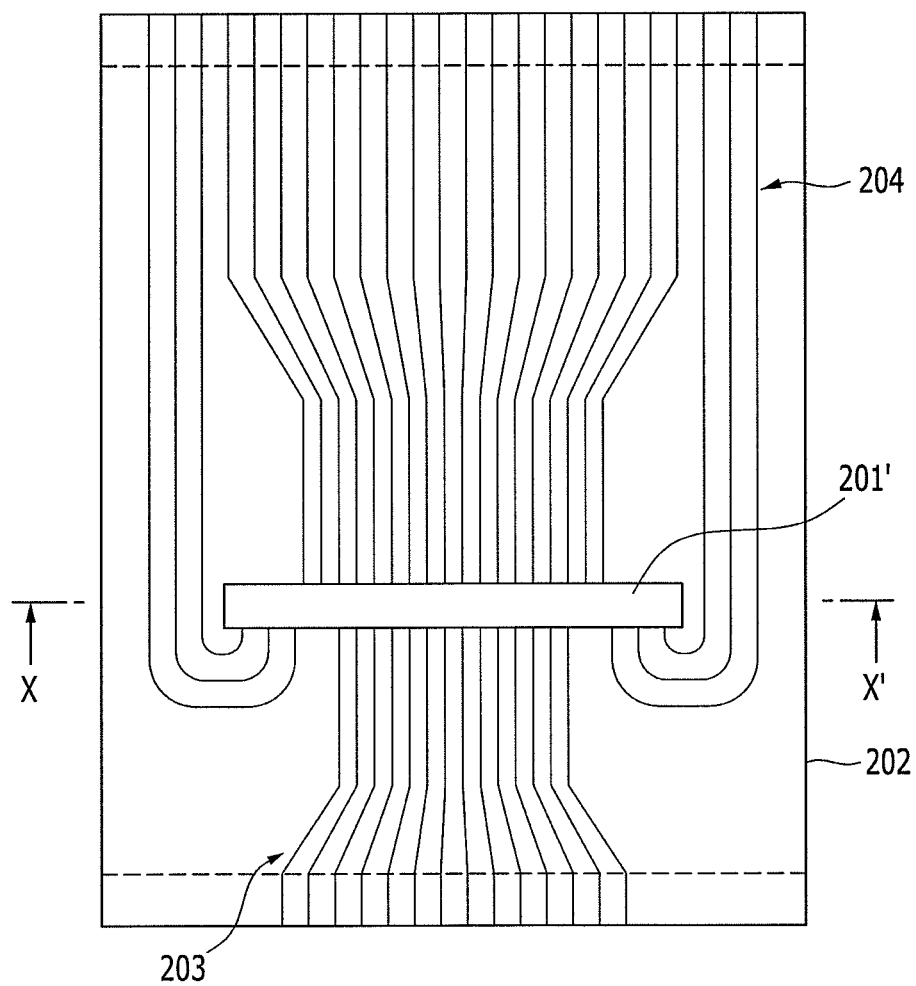
FIG. 9 illustrates a top plan view of a state of a curved display device in which a semiconductor chip package is unfolded according to a second exemplary embodiment.
Figure 10:
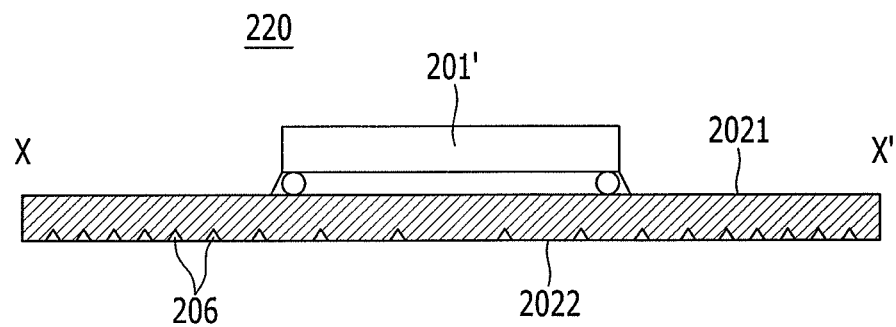
FIG. 10 illustrates a cross-sectional view along line X-X' of FIG. 9.
Figure 11:
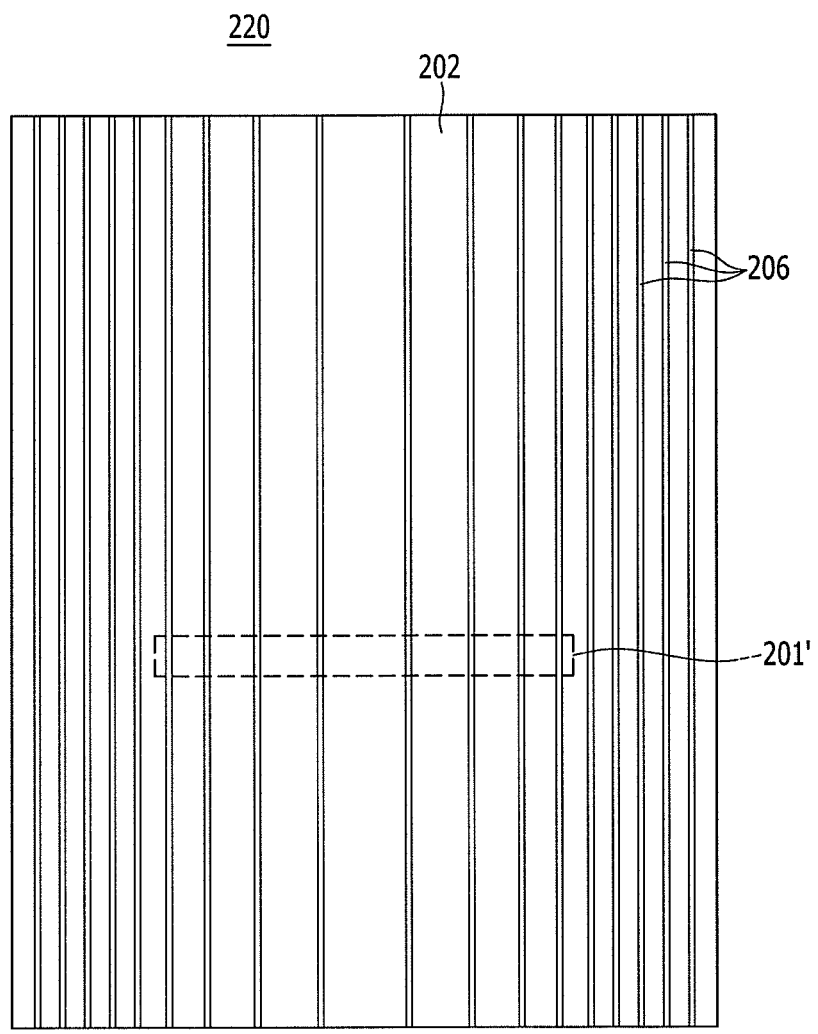
FIG. 11 illustrates a bottom view of the semiconductor chip package in FIG. 9.

FIG. 9 illustrates a top plan view of an unfolded semiconductor chip package in a curved display device according to a second exemplary embodiment, and FIG. 10 illustrates a cross-sectional view along line X-X' of FIG. 9. FIG. 11 illustrates a bottom view of the semiconductor chip package shown in FIG. 9.

Referring to FIG. 9 to FIG. 11, in the second exemplary embodiment, a semiconductor chip package 220 may include a single driving chip 201', and provides a condition by which a base film 202 can be more flexibly bent. Since the constituent elements of the curved display device according to the second exemplary embodiment are the same as those of the first exemplary embodiment, except for the semiconductor chip package 220, the semiconductor chip package 220 will be mainly described below.

The driving chip 201' is longitudinally disposed on a first surface 2021 of the base film 202 along a transversal direction (i.e., a horizontal direction on the basis of the drawing) of the semiconductor chip package 220. The input wire unit 203 is connected to a first long side of the driving chip 201' at a side of the driving chip 201', and the output wire unit 204 is connected to a second long side of the driving chip 201' at an opposite side of the driving chip 201'. Since the number of wires of the output wire unit 204 is larger than that of wires of the input wire unit 203, some of the output wires may be connected to the first long side of the driving chip 201'.

As illustrated in FIGS. 10-11, a plurality of groove portions 206 are formed at a second surface 2022 of the base film 202 in parallel with the longitudinal direction (i.e., a vertical direction) of the semiconductor chip package 220. A cross-section of each of the groove portions may have a V-shape (FIG. 10), and the groove portions 206 are disposed in parallel to be separated from each other. The plurality of grooves 206 may extend along the entire length of the second surface 2022, as illustrated in FIG. 11. In this case, the groove portions 206 may be formed to have a smaller distance between adjacent groove portions 206 as they are farther distanced from the center of the base film 202.

For example, the groove portions 206 may be disposed to have a large distance between adjacent groove portions 206 at the center of the base film 202, and may be disposed to have a smaller distance between adjacent groove portions 206 at edges of the base film 202. Accordingly, when a force causing transversal bending is applied to the base film 202, the base film 202 is flexibly bendable due to the groove portions 206. Particularly, the base film 202 may be more easily bendable at an edge at which the groove portions 206 are densely disposed.

Figure 12:
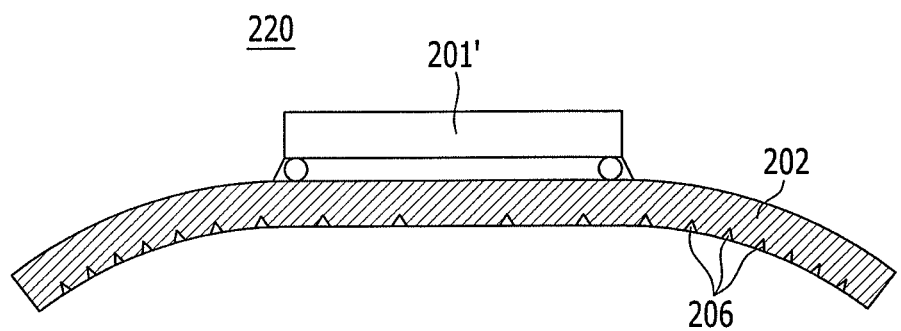
FIG. 12 illustrates a schematic diagram of a bent state of the semiconductor chip package shown in FIG. 10.

FIG. 12 illustrates a schematic diagram of a bent state of the semiconductor chip package shown in FIG. 10.

When a single, long semiconductor chip package is formed on a base film with no groove portions, when an external force causing transversal bending is applied, stress is generated in the base film. In contrast, referring to FIGS. 9-12, the semiconductor chip package 220 of the second exemplary embodiment includes a plurality of the groove portions 206. Therefore, when an external force causing transversal bending is applied, portions of the base film 202 at which the groove portions are formed are easily bent, and thus the base film 202 is easily bent along the transversal direction.

Accordingly, the semiconductor chip package 220 according to the second exemplary embodiment may flexibly adjust with the bending of the base film 202, and defects, e.g., cracks of the driving chip 201' or the wires and peeling of the semiconductor chip package 220 from the display panel 100 or the printed circuit board 300, may be efficiently suppressed from being generated.

Figure 13:
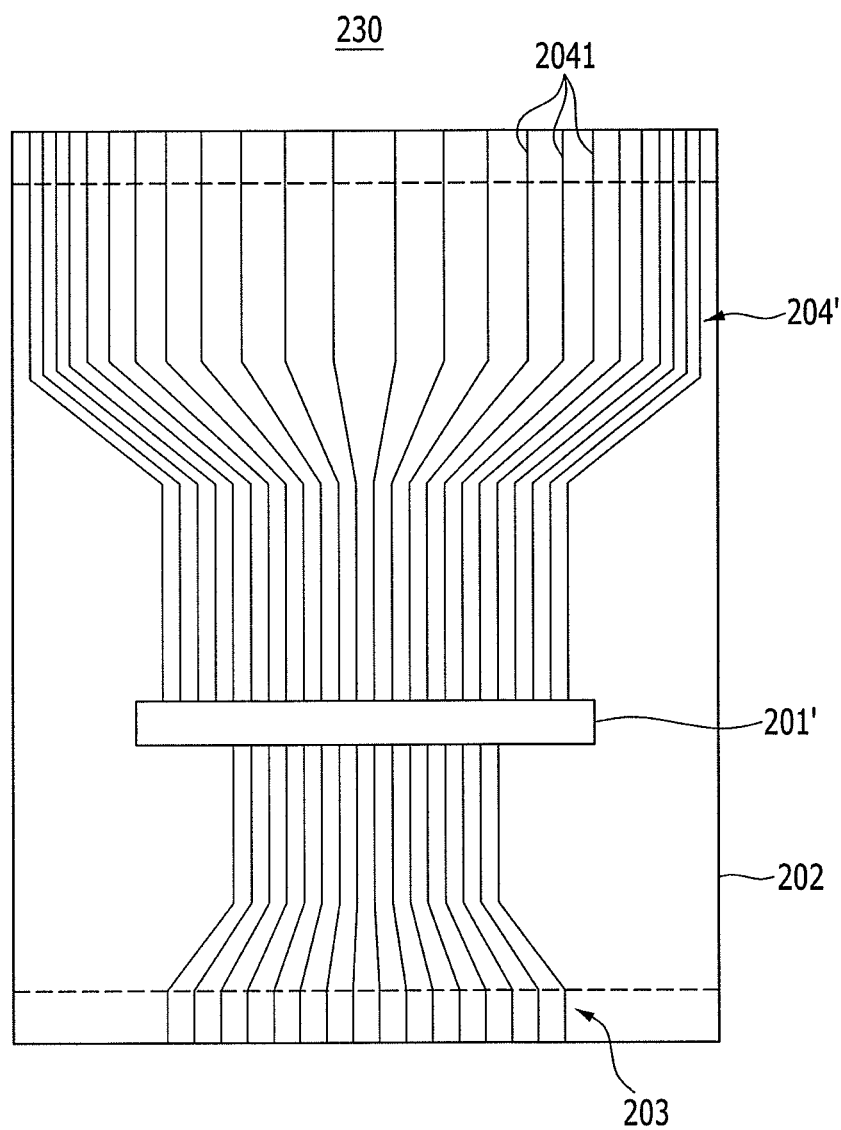
FIG. 13 illustrates a top plan view of a state of a curved display device in which a semiconductor chip package is unfolded according to a third exemplary embodiment.

FIG. 13 illustrates a top plan view of an unfolded semiconductor chip package in a curved display device according to a third exemplary embodiment.

Referring to FIG. 13, in the third exemplary embodiment, a semiconductor chip package 230 includes the single driving chip 201', and has a structure in which wires of an output wire unit 204' are disposed to have different distances apart according to a curvature (i.e., a bending level) thereof. Since the constituent elements of the curved display device according to the third exemplary embodiment are the same as those of the first exemplary embodiment, except for the semiconductor chip package 230, the semiconductor chip package 230 will be mainly described below.

The driving chip 201' is longitudinally disposed on the base film 202 along a transversal direction (i.e., a horizontal direction on the basis of the drawing) of the semiconductor chip package 230. The input wire unit 203 is connected to a first long side of the driving chip 201' at a side of the driving chip 201', and the output wire unit 204' is connected to a second long side of the driving chip 201' at an opposite side of the driving chip 201'. The output wire unit 204' includes output wires 2041, and the output wires 2041 are more densely disposed to have a smaller distance apart as they are closer to an edge of the base film 202.

The semiconductor chip package 230 is also bendable according to the curvature of the display panel 100. In this case, the curvature may be changed according to positions even at the inside of the semiconductor chip package 230. For example, the curvature of the center of the base film 202 close to the driving chip 201 may be larger than that of an outer periphery of the base film 202 distanced from the driving chip 201. A portion having a larger curvature receives a relatively larger tensile stress than that of a portion having a smaller curvature.

The output wires 2041 may be disposed to have short distances apart at an outer peripheral portion of the base film 202 which is largely bent, to increase a stress of the outer peripheral portion. Further, when end portions of the output wires 2041 are attached to the pad unit 103 of the display panel 100 by the second anisotropic conductive film 402 (see FIG. 2), it is possible to increase an adhesive area of the output wires 2041 and the pad unit 103 at the largely bent outer peripheral portion of the base film 202. As a result, a repulsive power of the outer peripheral portion caused by bending can be reduced.

As such, it is possible to increase the stress of the largely bent outer peripheral portion and decrease the repulsive power caused by the bending by forming the output wires 2041 to have different distances apart. As a result, the stress caused by the bending can be reduced to efficiently suppress generation of defects, e.g., cracks of the driving chip 201' or the wires and peeling of the semiconductor chip package 230 from the display panel 100 or the printed circuit board 300.

Figure 14:
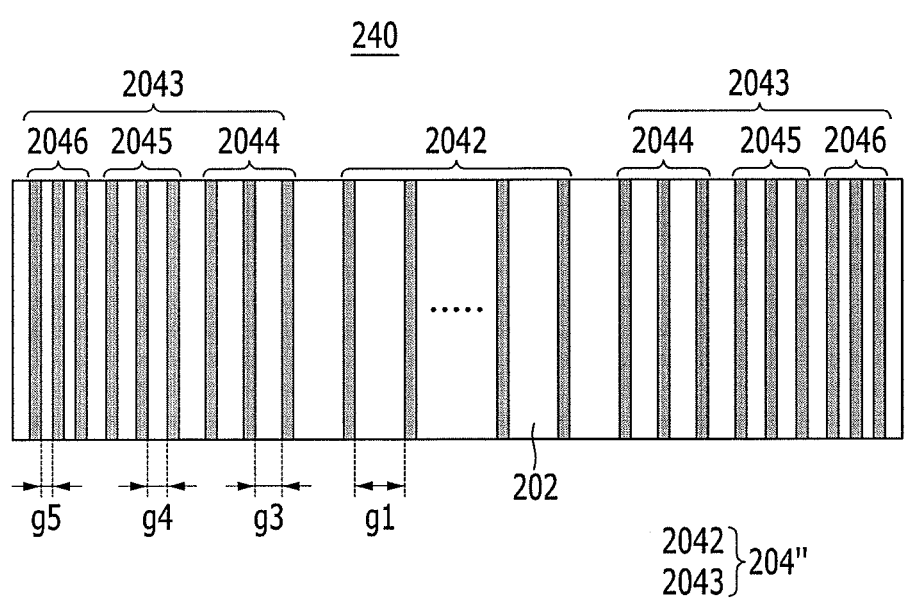
FIG. 14 illustrates a top plan view of a portion of an output wire unit of a semiconductor chip package included in a curved display device according to a fourth exemplary embodiment.

FIG. 14 illustrates a top plan view of a portion of an output wire unit of a semiconductor chip package included in a curved display device according to a fourth exemplary embodiment.

Referring to FIG. 14, in the fourth exemplary embodiment, a semiconductor chip package 240 includes the same or similar constituent elements as those of the aforementioned third exemplary embodiment, except for grouping of output wires of an output wire unit 204''. Constituent elements that are different from those of the third exemplary embodiment will be mainly described.

In detail, the output wires are grouped into first wires 2042 for outputting changed, e.g., varying, signals, e.g., image data, and second wires 2043 for outputting fixed signals. The first wires 2042 are disposed at a center of the base film 202 having a small curvature, and the second wires 2043 are disposed at an outer peripheral portion of the base film 202 having a large curvature. The first wires 2042 may be disposed at equal distances apart, and a first distance g1 between adjacent first wires 2042 is larger than a distance between adjacent second wires 2043.

The second wires 2043 may be divided into a plurality of wires according to kinds of signals. For example, the second wires 2043 may be divided into third wires 2044 for outputting option signals, fourth wires 2045 for outputting power signals, and fifth wires 2046 for outputting ground signals. The third wires 2044, the fourth wires 2045, and the fifth wires 2046 may be sequentially disposed in that order be close, e.g., relative, to the first wires 2042.

The third wires 2044 may be disposed at equal distances apart, and a third distance g3 between the third wires 2044 is smaller than the first distance g1. The fourth wires 2045 may be disposed at equal distances apart, and a fourth distance g4 between adjacent fourth wires 2045 is smaller than the third distance g3. The fifth wires 2046 may be disposed at equal distances apart, and a fifth distance g5 between adjacent fifth wires 2046 is smaller than the fourth distance g4. A pitch of the fifth wires 2046 satisfies a permissible pitch range by which the bonding can be possible.

Since the third wires 2044, the fourth wires 2045, and the fifth wires 2046 output signals of the same polarity, it is possible to reduce a driving error possibility caused by a progressive circuit-short even when a distance between wires is set to be small.

Figure 15A:
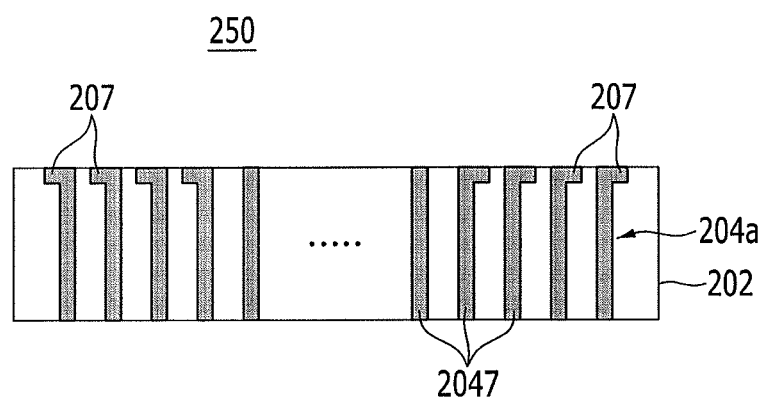
FIG. 15A and FIG. 15B illustrate top plan views of a portion of an output wire unit of a semiconductor chip package included in a curved display device according to a fifth exemplary embodiment.
Figure 15B:
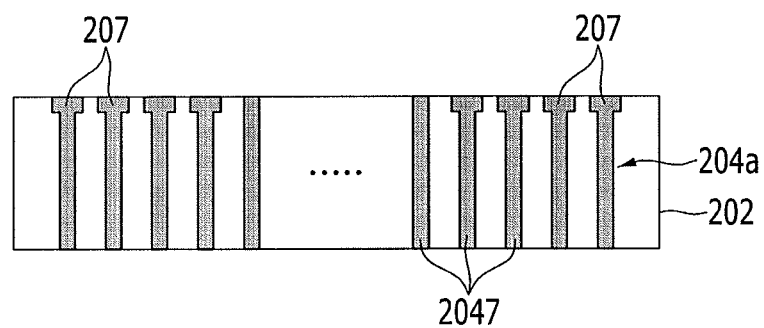

FIG. 15A and FIG. 15B illustrate top plan views of a portion of an output wire unit of a semiconductor chip package included in a curved display device according to a fifth exemplary embodiment.

Referring to FIG. 15A and FIG. 15B, in the fifth exemplary embodiment, a semiconductor chip package 250 has the same constituent elements as those of the semiconductor chip package according to any one of the first to fourth exemplary embodiments. In FIG. 15A and FIG. 15B, the output wire unit of the first exemplary embodiment is illustrated as a basic structure, and constituent elements that are different from the aforementioned exemplary embodiments will be mainly described.

A second end of the semiconductor chip package 250, at which an end portion of an output wire unit 204a is disposed, is attached to the pad unit 103 of the display panel 100 by the second anisotropic conductive film 402 (see FIG. 2). End portions of output wires 2047 of the output wire unit 204a are electrically connected to the pad electrodes included in the pad unit 103 by a conductive ball (not shown) included in the second anisotropic conductive film 402.

The size of the end portions of ones disposed at an outer peripheral portion of the base film 202 among the output wires 2047 is increased by forming an extension 207 at the corresponding end portion. The outer peripheral portion of the base film 202 is largely bent, and thus concentratedly receives a stress. Accordingly, by expanding an attached area of the output wires 2047 to the pad unit 103, it is possible to reduce a repulsive power of the outer peripheral portion caused by bending. As a result, it is possible to suppress the peeling of the output wires 2047 caused by the bending.

The extension 207 may be formed to have a quadrangular shape. The extension 207 may be connected to one side of the corresponding output wire 2047 (see FIG. 15A), or may be connected to the center of an end portion of the corresponding output wire 2047 to form a T shape together with the output wiring 2047

Figure 16A:
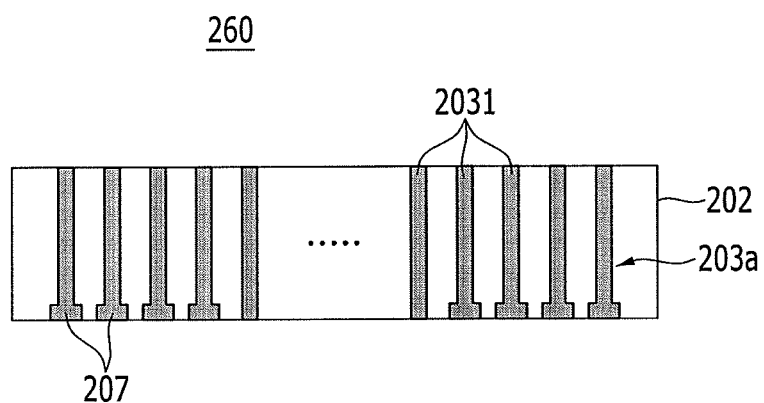
FIG. 16A and FIG. 16B illustrate top plan views of a portion of an output wire unit of a semiconductor chip package included in a curved display device according to a sixth exemplary embodiment.
Figure 16B:
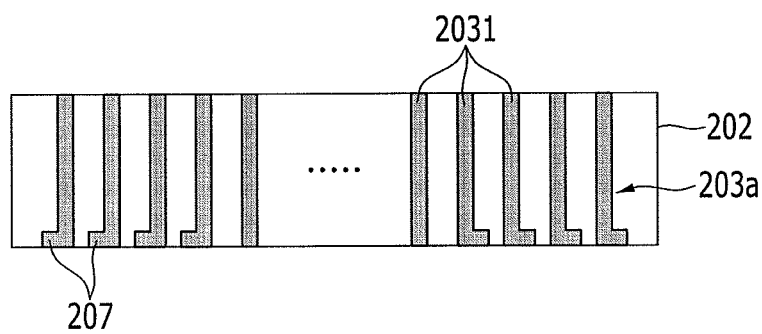

In the meantime, the printed circuit board 300 may also be bendable with the same curvature as that of the display panel 100, and thus an input wire unit 203*a* may also include an extension. FIG. 16A and FIG. 16B illustrate top plan views of a portion of an output wire unit of a semiconductor chip package included in a curved display device according to a sixth exemplary embodiment.

Referring to FIG. 16A and FIG. 16B, in the sixth exemplary embodiment, a semiconductor chip package 260 includes the same constituent elements as those of the aforementioned fifth exemplary embodiment, except for the input wire unit 203*a*. Constituent elements that are different from the aforementioned exemplary embodiments will be mainly described.

The size of the end portions of ones disposed at an outer peripheral portion of the base film 202 among input wires 2031 is increased by forming the extension 207 at the corresponding end portion. Accordingly, it is possible to reduce a repulsive power of the outer peripheral portion caused by bending. As a result, the peeling of the input wires 2031 caused by the bending can be suppressed.

The extension 207 may be formed to have a quadrangular shape. The extension 207 may be connected to the center of an end portion of a corresponding input wire 2031 to form a T shape together with the input wiring 2031 (see FIG. 16A), or may be connected to one side of the corresponding input wire 2031 (see FIG. 16B).

By way of summation and review, a conventional semiconductor chip package may be attached to a display panel to be bent along a longitudinal direction. In this case, a base film of the semiconductor chip package has flexibility that is similar to that of the display panel, but the driving chip of the semiconductor chip package has little or no flexibility. Accordingly, stress is generated around the driving chip during bending.

The stress caused by the bending may result in cracks in the driving chip or in the wires, or may cause peeling of semiconductor chip package off the display panel or the printed circuit board. Further, as a horizontal width of the curved display device is widened and the bending level is increased vulnerability of the semiconductor chip package caused by the stress is further increased.

In contrast, according to embodiments, a curved display device can suppress generation of defects such as cracks in the driving chips, cracks of the input wire unit or the output wire unit, minute peeling between the driving chips and the input wire unit or the output wire unit, peeling between the semiconductor chip package and the pad unit, and peeling between the semiconductor chip package and the printed circuit board, which may be generated in a bending condition, and can improve durability and reliability of products.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A curved display device, comprising:
   a semiconductor chip package including a base film, a plurality of driving chips on the base film, and an input wire unit and an output wire unit connected to the driving chips;
   a printed circuit board (PCB) connected to the input wire unit of the semiconductor chip package; and
   a display panel including a display unit and a pad unit connected to the output wire unit of the semiconductor chip package,
   wherein the display panel, the semiconductor chip package, and the PCB are bendable and are curved in a first direction, and the driving chips of the semiconductor chip package are separated from each other along the curve in the first direction.

2. The curved display device as claimed in claim 1, wherein:
   the input wire unit is simultaneously connected to the plurality of driving chips, and
   a connection wire for transferring a carry signal is disposed between adjacent driving chips.

3. The curved display device as claimed in claim 2, wherein the input wire unit includes a plurality of input wires, each of the input wires including main wires and branched wires branched from the main wires and connected to the driving chips.

4. The curved display device as claimed in claim 3, wherein the driving chips receive the same data through the input wire unit, and input data is stored in a corresponding driving chip according to the carry signal.

5. The curved display device as claimed in claim 4, wherein the driving chips output an analog voltage, to which the input data is converted, to the output wire unit according to an input synchronization signal.

6. The curved display device as claimed in claim 1, wherein each of the driving chips includes two long sides, the two long sides being parallel with the first direction or with a second direction crossing the first direction.

7. A curved display device, comprising:
   a semiconductor chip package including a base film, a driving chip on a first surface of the base film, an input wire unit and an output wire unit connected to the driving chip, and a plurality of groove portions on a second surface of the base film;
   a printed circuit board (PCB) connected to the input wire unit; and
   a display panel including a display unit and a pad unit connected to the output wire unit,
   wherein the display panel, the semiconductor chip package, and the PCB are bendable in a first direction, and the groove portions are longitudinally disposed in a second direction crossing the first direction.

8. The curved display device as claimed in claim 7, wherein the groove portions are densely disposed to have a smaller distance apart as they are farther distanced from a center of the base film.

9. A curved display device, comprising:
a semiconductor chip package including a base film, a driving chip on the base film, and an input wire unit and an output wire unit connected to the driving chip;
a printed circuit board (PCB) connected to the input wire unit; and
a display panel including a display unit and a pad unit connected to the output wire unit,
wherein the display panel, the semiconductor chip package, and the printed circuit board are bendable in a first direction, and the output wire unit includes a plurality of output wires having a smaller distance apart as they are farther distanced from a center of the base film.

10. The curved display device as claimed in claim 9, wherein the output wires are grouped according to kinds of output signals, the output wires within each group being disposed at equal distances apart.

11. The curved display device as claimed in claim 10, wherein the output wires include:
first wires disposed at the center of the base film to output varying signals; and
second wires disposed at an outer peripheral portion of the base film to output fixed signals.

12. The curved display device as claimed in claim 11, wherein:
the second wires include third wires for outputting option signals, fourth wires for outputting power signals, and fifth wires for outputting ground signals, and
the third wires, the fourth wires, and the fifth wires are sequentially disposed in the stated order relative to the first wires.

13. The curved display device as claimed in claim 9, wherein the output wire unit includes a plurality of output wires, the plurality of output wires at an outer peripheral portion of the base film including respective extensions at end portions thereof.

14. The curved display device as claimed in claim 13, wherein the input wire unit includes a plurality of input wires, the plurality of input wires at an outer peripheral portion of the base film including respective extensions at end portions thereof.

* * * * *